us006096615A

United States Patent [19]
Gardner et al.

[11] Patent Number: 6,096,615
[45] Date of Patent: Aug. 1, 2000

[54] METHOD OF FORMING A SEMICONDUCTOR DEVICE HAVING NARROW GATE ELECTRODE

[75] Inventors: Mark Gardner, Cedar Creek; Derick J. Wristers, Austin, both of Tex.

[73] Assignee: Advanced Micro Devices, Inc., Sunnyvale, Calif.

[21] Appl. No.: 09/069,505

[22] Filed: Apr. 29, 1998

[51] Int. Cl.$^7$ ................................................. H01L 21/336
[52] U.S. Cl. .......................... 438/305; 438/257; 438/263
[58] Field of Search ................................... 438/231, 232, 438/257, 263, 264, 265, 286, 287, 303, 305, 306, 372

[56] References Cited

U.S. PATENT DOCUMENTS 5,286,664  2/1994  Horiuchi ................................ 438/305
5,384,272  1/1995  Ibok et al. ............................. 438/262
5,672,531  9/1997  Gardner et al. ....................... 438/305
5,759,897  6/1998  Kadosh et al. ........................ 438/286

*Primary Examiner*—Charles Bowers
*Assistant Examiner*—Jack Chen

[57] ABSTRACT

A semiconductor device having a narrow gate electrode and a process of fabricating such a device is disclosed. The semiconductor device is formed by forming a polysilicon block over a substrate and forming a nitride spacer adjacent at least one sidewall of the polysilicon block. A portion of the polysilicon block opposite the nitride spacer is selectively removed. The polysilicon block is then oxidized to form an oxide portion adjacent one side of the polysilicon block and to form a narrow polysilicon block, wherein the nitride spacer inhibits oxidation of another side of the polysilicon block. The narrow polysilicon block is used as a gate electrode.

32 Claims, 3 Drawing Sheets

METHOD OF FORMING A SEMICONDUCTOR DEVICE HAVING NARROW GATE ELECTRODE

FIELD OF THE INVENTION

The present invention is directed generally to semiconductor devices and, more particularly, to a semiconductor device having a narrow gate electrode and a process of fabricating such a device.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicability and numerous disciplines. One such silicon-based semiconductor device is a metal-oxide-semiconductor (MOS) transistor.

The principal elements of a typical MOS semiconductor device are illustrated in FIG. 1. The device generally includes a gate electrode 101, which acts as a conductor, to which an input signal is typically applied via a gate terminal (not shown). Heavily doped source 103 and drain 105 regions are formed in a semiconductor substrate 107 and are respectively connected to source and drain terminals (not shown). A channel region 109 is formed in the semiconductor substrate 107 beneath the gate electrode 101 and separates the source 103 and drain 105 regions.

The source/drain regions 103 and 105, illustrated in FIG. 1, are lightly-doped-drain (LDD) structures. LDD structures include lightly-doped, lower conductivity regions 106 near the channel region 109 and heavily-doped, higher conductivity regions 103 and 105 typically connected to the source/drain terminals. Generally, the LDD structures are typically formed by making two implants in the substrate. The first dopant is implanted adjacent the gate electrode 101 at relatively low concentration levels to form the lightly-doped regions 106. Spacers 102 are then formed on sidewalls of the gate electrode 101 and a second dopant is implanted into the active regions at higher concentration levels to form the heavily-doped regions 103 and 105. The substrate is typically annealed to drive the dopant in the heavily-doped regions deeper into the substrate 107.

The channel is typically lightly doped with a dopant type opposite to that of the source 103 and drain 105 regions. The gate electrode 101 is physically separated from the semiconductor substrate 107 by an insulating layer 111, typically an oxide layer such as $SiO_2$. The insulating layer 111 is provided to prevent current from flowing between the gate electrode 101 and the semiconductor source region 103, drain region 105 or channel region 109.

In operation, an output voltage is typically developed between the source and drain terminals. When an input voltage is applied to the gate electrode 101, a transverse electric field is set up in the channel region 109. By varying the transverse electric field, it is possible to modulate the conductance of the channel region 109 between the source region 103 and drain region 105. In this manner an electric field controls the current flow through the channel region 109. This type of device is commonly referred to as a MOS field-effect-transistors (MOSFET).

Semiconductor devices, like the one described above, are used in large numbers to construct most modern electronic devices. In order to increase the capability of such electronic devices, it is necessary to integrate even larger numbers of such devices into a single silicon wafer. As the semiconductor devices are scaled down (i.e., made smaller) in order to form a larger number of devices on a given surface area, the structure of the devices and fabrication techniques used to make such devices must be altered.

One important step in the manufacture of MOS devices is the formation of the gate electrode. The gate electrode is typically formed by depositing a layer of polysilicon and selectively removing portions of the polysilicon layer, using well-known photolithography and etching techniques. These conventional techniques for forming gate electrodes however impose limitations on the minimum width of the gate electrode. The resolution of the photolithography process, in particular, imposes limitations on the minimum width of the gate electrode. As the thresholds for minimum thickness are reached, the ability to further scale down the semiconductor devices is hindered.

SUMMARY OF THE INVENTION

Generally, the present invention provides a semiconductor device having a narrow gate electrode and a method of manufacture thereof. Consistent with one embodiment of the present invention, a semiconductor device is formed by forming a polysilicon block over a substrate and forming a nitride spacer adjacent at least one sidewall of the polysilicon block. A portion of the polysilicon block opposite the nitride spacer is selectively removed. The polysilicon block is oxidized to form an oxide portion adjacent one side of the polysilicon block and to form a narrow polysilicon block, whereby the nitride spacer inhibits oxidation of another side of the polysilicon block. The narrow polysilicon block is used as a gate electrode.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
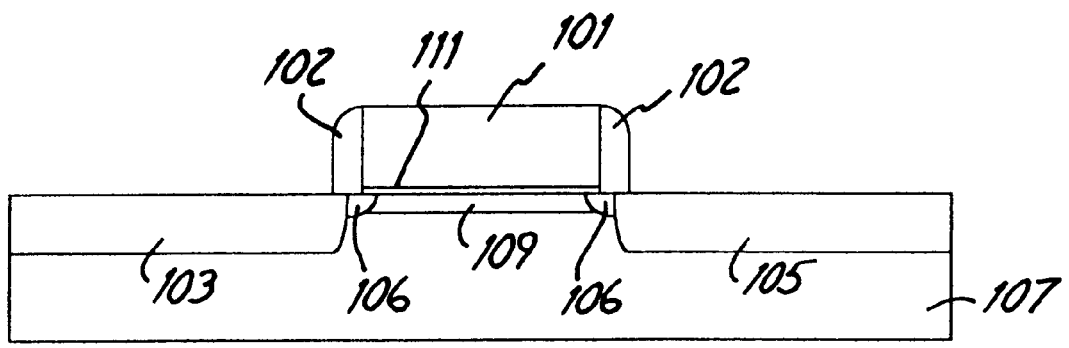
FIG. 1 illustrates components of a MOS semiconductor device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

The present invention is believed to be applicable to a number of semiconductor devices which have gate electrodes. Suitable devices include, for example, MOS, CMOS, and BiCMOS devices. The invention is believed to be particularly advantageous in applications where it is desirable to form narrow gate electrodes. While the present invention is not so limited, an appreciation of various aspects of the invention is best gained through a discussion of various application examples of processes used to form such semiconductor devices.

Figure 2A:
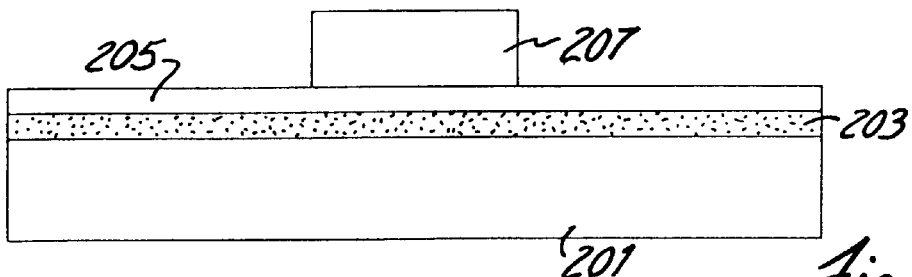
FIGS. 2A–2G illustrate an exemplary process in accordance with one embodiment of the invention.

FIGS. 2A–2G illustrate an exemplary process for fabricating a semiconductor device having one or more narrow gate electrodes. In this process, an insulating layer 203 is formed on a substrate 201, typically a silicon substrate, as illustrated in FIG. 2A. The insulating layer 203 may be formed from a number of different dielectric materials using, for example, known deposition or growth techniques. Suitable materials include oxides, such as $SiO_2$.

A second insulating layer 205 is then formed over the oxide layer 203. The insulating layers 203 and 205 will be used as a gate insulating layer for one or more gate electrodes. The second insulating layer 205 may be formed from a variety of dielectric materials using, for example, well-known deposition techniques. Suitable dielectric materials include nitrides, such as silicon nitride, for example. The individual thicknesses of the two insulating layers 203 and 205 can vary, for example, depending on the desired composite capacitance of the two insulating layers 203 and 205. Typically, the composite capacitance of the two layers 203 and 205 is selected to provide capacitance equivalent to 10 to 25 Å of silicon dioxide.

One or more polysilicon blocks (only one of which is shown) are typically formed over the insulating layer 205. The resultant structure is shown in FIG. 2A. The polysilicon block 207 will be used to form a gate electrode. The polysilicon block 207 may be formed using, for example, well-known deposition, masking, and etching techniques. For example, the polysilicon block 207 may be formed by forming a polysilicon layer over the second insulating layer 205 and selectively removing portions of the polysilicon layer to form the polysilicon block 207. Removal of the portions of the polysilicon layer may be performed using, for example, well-known photolithography techniques. Generally, this involves forming a photoresist layer over the polysilicon layer and developing the photoresist to form openings therein. Portions of the polysilicon layer exposed by the openings are removed to form the polysilicon block 207. For many applications, the width of the polysilicon block 207 can vary from about 0.15 to 0.20 microns, with the minimum width being typically limited by the resolution of the photolithography or etching equipment used. For example, at present, the minimum resolution of such equipment (and thus the minimum width of the polysilicon block 207) is about 0.15 microns. However, further reductions in photolithography and/or etching techniques are anticipated and are intended to be covered by the present invention.

Regions 209 of the substrate 201 adjacent the polysilicon block 207 are doped with a dopant (for example, arsenic, phosphorus or boron). In the illustrated embodiment, the doped regions 209 will be used to form lightly-doped regions of an LDD source/drain region, as discussed below. The doped regions 209 are typically formed by implantation. The implant energies and dosages are selected in consideration of the desired profile of the doped regions 209. Suitable concentrations range from about 5E13 to 8E14 ($5 \times 101^{13}$ to $8 \times 10^{14}$) dopant atoms/cm$^2$, while suitable implant energies range from about 5 to 20 keV for many applications.

A third insulating layer 211 is typically formed over the second insulating layer 205. The third insulating layer 211 is typically selectively removable relative to the second insulating layer 205. The third insulating layer 211 may be formed from a number of different dielectric materials using, for example, known deposition techniques. Suitable materials include oxides, such as $SiO_2$. In forming the third insulating layer 211, vertical portions 210 are typically formed adjacent sidewalls of the polysilicon block 207. One or both of the vertical portions 210 may later be used as a "spacer" to space a subsequent implant of a dopant from the polysilicon block 207. The thickness of the vertical portions 210 will generally be selected in consideration of the desired implant spacing. Suitable thicknesses range from about 50 to 200 Å for many applications.

Figure 2B:
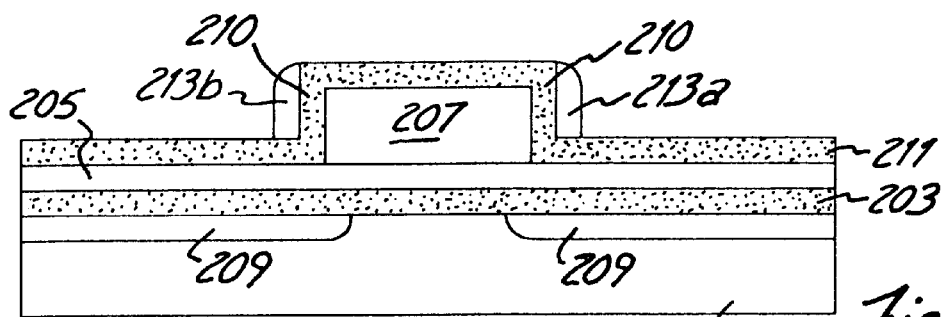

Nitride spacers 213a and 213b are then formed adjacent the vertical portions 210 on the sidewalls of the polysilicon block 207. The resultant structure is illustrated in FIG. 2B. As will be discussed below, the nitride spacer 213a will be used to inhibit oxidation of one side of the polysilicon block 207 and may also be used to space a subsequent dopant implant from the polysilicon block 207. The thickness of the nitride spacers 213a is typically chosen in consideration of adequate oxidation inhibition as well as the desired dopant spacing. Suitable nitride spacer thicknesses range from about 50 to 300 Å for many applications.

Figure 2C:
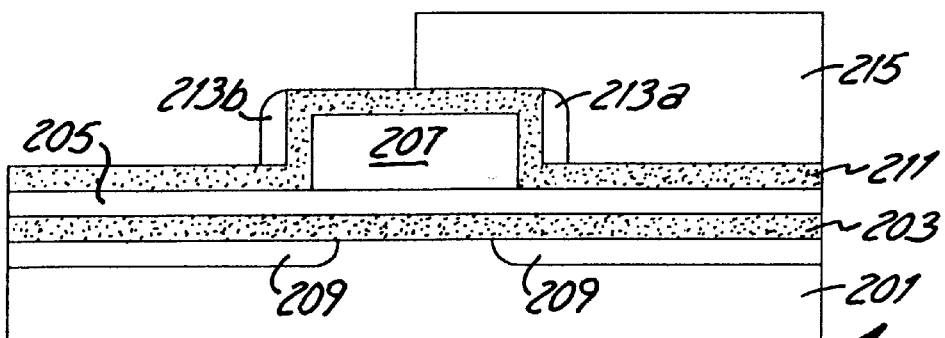
Figure 2D:
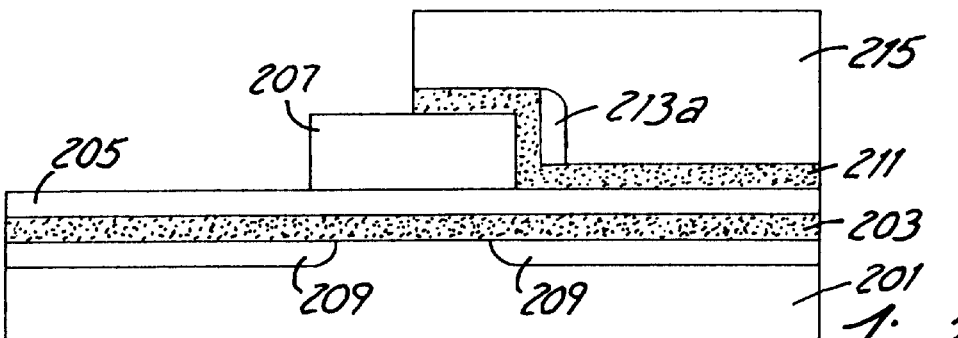

A masking layer 215 is then formed over the substrate 201 to selectively expose part of the polysilicon block 207, leaving a remaining portion of the polysilicon block 207 covered. The resultant structure is shown in FIG. 2C. The masking layer 215 may, for example, be formed from a photoresist, using well-known techniques. The exposed portion of the polysilicon block 207 will be removed to reduce the width of the polysilicon block 207. The width of the exposed portion can vary depending on the desired width of the resultant gate electrode. In the illustrated embodiment, approximately half of the polysilicon block 207 is exposed. In other applications more or less of the polysilicon block 207 can be exposed. The exposed nitride spacer 213b and an exposed part of the third insulating layer 211 are then removed using, for example, known techniques such as etching. The resultant structure is shown in FIG. 2D.

Figure 2E:
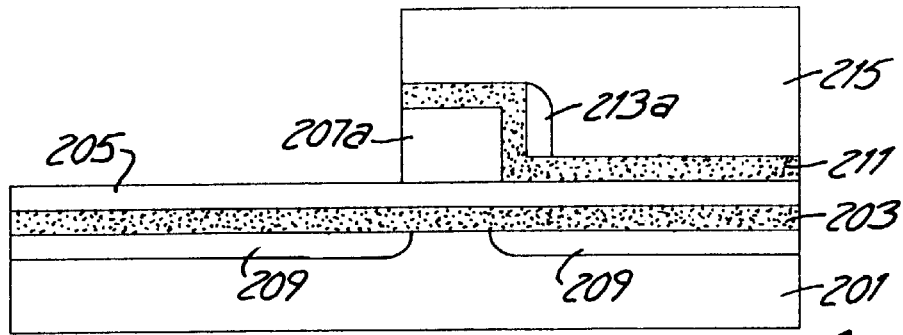

The exposed portion of the polysilicon block 207 is then removed. The removal may be carried out using, for example, well-known techniques such as etching. If desired, a dopant may then be implanted into the substrate 201 to extend the doped region 209 to the edge of the remaining polysilicon block 207a. The resultant structure is shown in FIG. 2E. The implant characteristics of the dopant may be similar to those of the dopant implanted in regions 209. Optionally, depending on the amount by which the polysilicon block width is reduced, the implant may be omitted with the lightly-doped region 209 simply extending to the remaining polysilicon block 207a by diffusion due to subsequent heat treatment steps. The remaining portion of the masking layer 215 is then removed.

Figure 2F:
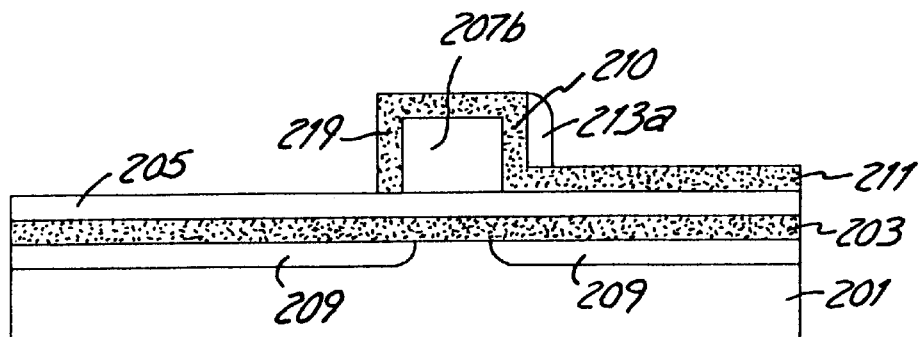

The width of the polysilicon block 207a may then be further reduced by oxidizing the polysilicon block 207a to form silicon dioxide 219 on exposed portions of the remaining polysilicon block 207b. The oxidation will also typically increase the thickness of the oxide layer 211 on top of the remaining polysilicon block 207b. The resultant structure is shown in FIG. 2F. The polysilicon block 207a may be oxidized using, for example, well-known oxidation techniques. The polysilicon block 207b will be used as a gate electrode, while the silicon dioxide 219 may be used as a spacer in subsequent implant steps. The width of the silicon dioxide 219 is typically selected in consideration of the desired width of the remaining polysilicon block 207b as well as any desired spacing of dopants. Suitable thicknesses of the silicon dioxide 219 range from about 150 to 500 Å for many applications. Typically, for every one Å of $SiO_2$ which is grown, ½ Å of polysilicon is consumed. Thus, using a 0.2 microns polysilicon block which is the reduced in half, the width of the resultant polysilicon block 207b can range from about 750 to 925 Å.

When the silicon dioxide 219 is formed, the nitride spacer 213a inhibits oxidation of the sidewall of the polysilicon block 207b which it covers. This allows the polysilicon block 207b to be formed with oxide spacers 210 and 219 that have different thicknesses. The oxide spacers 210 and 219 with different thickness may be useful in the subsequent dopant implant step, for example, by spacing the implanted dopant differently on each side of the polysilicon block 207b.

Figure 2G:
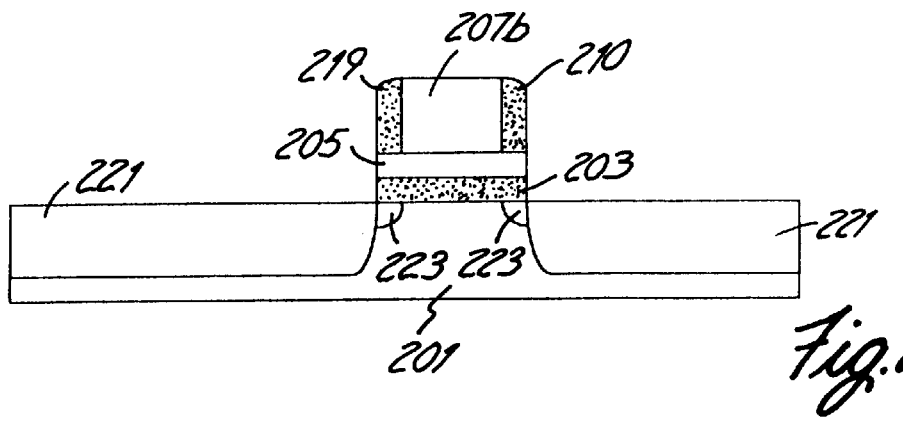

In the illustrated embodiment, the remaining nitride spacer 213a and the portion of the oxide layer 211 on top of the polysilicon block 207b are removed using, for example, known etching techniques. Portions of the first and second insulating layers 203 and 205 adjacent the polysilicon block 207 may also be removed, e.g. by etching, to expose active regions of the substrate 201 adjacent the polysilicon block 207. Suitable etching techniques include plasma etching techniques, for example. A dopant is then implanted into the substrate 201 to form heavily-doped regions 221 in the substrate 201. The resultant structure is shown in FIG. 2G. The heavily-doped regions 221 may be used as source/drain regions of LDD source/drain regions. This dopant implant is typically a heavier dose of a similar type or the same dopant as was used in forming the lightly-doped regions 209. The implant energies and dosages are typically selected in consideration of the desired dopant profile of the heavily-doped regions 221. For many applications, dopant dosages ranging from about 2E15 to 8E15 dopant atoms/$cm^2$ and energies ranging from about 5 to 20 keV would be suitable. Fabrication of the semiconductor device may continue with well-known processing steps such as silicidation, contact formation, and so forth, to complete the device structure.

Using the above processes, a semiconductor device having a narrow gate electrode may be formed. Moreover, by forming the gate electrode using oxidation the gate electrode can be formed with increased precision. The above process also provides oxide spacers on sides of the gate electrode with different thicknesses. This can, for example, allow source/drain regions to be spaced differently on each side of the gate electrode.

It is noted that the above process is provided by way of example and not of limitation. Many variations of the process would be apparent to one skilled in the art. For example, the doping of the substrate to form the heavily-doped regions 221 may be performed with the nitride spacer 213a and/or one or more of the insulating layers 203, 205 and 211 in place. Moreover, the number of insulating layers used can vary. For instance, the nitride spacers 213a and 213b may be formed directly against sidewalls of the polysilicon block 207 with the third insulating layer 211 and second insulating layer 205 omitted. In another embodiment, the first insulating layer 203 may be omitted such that the second insulating layer 205 is formed directly on the substrate 201.

The present invention is applicable to the fabrication of a number of different devices which may benefit from having a narrow gate electrode. Accordingly, the present invention is not limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed, upon review of the present specification. The claims are intended to cover such modifications and devices.

What is claimed is:

1. A process of fabricating a semiconductor device, comprising:
    forming a polysilicon block over a substrate;
    forming a nitride spacer adjacent at least one sidewall of the polysilicon block;
    selectively removing a portion of the polysilicon block opposite the nitride spacer; and
    oxidizing the polysilicon block to form an oxide portion adjacent one side of the polysilicon block and to form a narrow polysilicon block, the nitride spacer inhibiting oxidation of another side of the polysilicon block,
    wherein the narrow polysilicon block is used as a gate electrode.

2. The process of claim 1, further including forming a first insulating layer over the substrate prior to forming the polysilicon block.

3. The process of claim 2, wherein forming the first insulating layer includes forming a bottom layer and forming a top layer over the bottom layer.

4. The process of claim 3, wherein forming the bottom layer includes forming an oxide layer.

5. The process of claim 3, wherein forming the top layer includes forming a nitride layer.

6. The process of claim 2, further including forming a second insulating layer over the first insulating layer and the polysilicon block prior to forming the nitride spacer.

7. The process of claim 6, wherein forming the second insulating layer includes forming an oxide layer.

8. The process of claim 7, wherein forming the oxide layer includes forming vertical oxide portions adjacent the polysilicon block having a thickness ranging from about 50 to 200 Å.

9. The process of claim 6, further including removing the second insulating layer from the portion of the polysilicon block and from the first insulating layer adjacent the portion of the polysilicon block before selectively removing the portion of the polysilicon block.

10. The process of claim 1, wherein selectively removing the portion of the polysilicon block includes etching the portion of the polysilicon block.

11. The process of claim 1, wherein the oxide portion has a thickness ranging from about 150 to 500 Å.

12. The process of claim 1, further including removing the nitride spacer after oxidizing the polysilicon block.

13. The process of claim 2, further including implanting a first dopant into an active region of the substrate adjacent the polysilicon block.

14. The process of claim 13, further including implanting a second dopant into the substrate adjacent the polysilicon block after selectively removing the portion of the polysilicon block and before oxidizing the polysilicon block.

15. The process of claim 14, wherein implanting the second dopant includes extending a lightly-doped region to the polysilicon block.

16. The process of claim 14, further including implanting a third dopant into the active region adjacent the polysilicon block after oxidizing the polysilicon block.

17. The process of claim 16, wherein implanting the third dopant includes forming a heavily-doped region in the active region.

18. The process of claim 1, wherein oxidizing the polysilicon block leaves the width of the polysilicon block less than 1000 Å.

19. The process of claim 1, further including:
   implanting a first dopant into the substrate, after forming the polysilicon block, to form a first lightly doped region adjacent a first side of the polysilicon block and a second lightly doped region adjacent a second side of the polysilicon block, wherein the removed portion of the polysilicon block includes the second side; and
   extending the second lightly doped region to the polysilicon block after selectively removing the portion of the polysilicon block.

20. The process of claim 19, further including implanting a second dopant into the substrate, with the oxide portion in place, to form a first heavily doped region adjacent the first lightly doped region and a second heavily doped region adjacent the second lightly doped region.

21. The process of claim 19, wherein extending the second lightly doped region includes implanting a third dopant into the substrate.

22. The process of claim 19, wherein extending the second lightly doped region includes diffusing the second lightly doped region through heat treatment.

23. The process of claim 1, further including, forming a nitride layer over the substrate prior to forming the polysilicon block, wherein,
   while oxidizing the polysilicon block, portions of the nitride layer extend outward from the polysilicon block.

24. The process of claim 23, further including forming an oxide layer over the substrate before forming the nitride layer.

25. The process of claim 1, further including removing the nitride spacer after oxidizing the polysilicon block and implanting a dopant into the substrate after removing the nitride spacer.

26. The process of claim 1, further including:
   forming an oxide layer on the sidewall of the polysilicon block before forming the nitride spacer;
   removing the nitride spacer after oxidizing the polysilicon block; and
   implanting, with the oxide layer and the oxide portion in place, a dopant into the substrate after removing the nitride spacer to form source/drain regions adjacent the narrow polysilicon block;
   wherein the oxide layer has a different thickness than the oxide portion, thereby spacing the source/drain regions from the narrow polysilicon block by different amounts.

27. The process of claim 26, wherein the oxide layer has a thickness ranging from about 50 to 200 Å and the oxide portion has a thickness ranging from about 150 to 500 Å.

28. The process of claim 1, wherein oxidizing the polysilicon block includes forming the oxide portion to a thickness of at least about 150 angstroms.

29. The process of claim 1, wherein oxidizing the polysilicon block includes forming the oxide portion to a thickness of at least about 200 angstroms.

30. The process of claim 1, wherein oxidizing the polysilicon block includes forming the oxide portion to a thickness of at least about 300 angstroms.

31. A process of fabricating a semiconductor device, comprising:
   depositing a gate insulating layer over a substrate;
   forming a polysilicon block over the gate insulating layer;
   implanting a first dopant into substrate regions adjacent the polysilicon block to form lightly-doped regions;
   forming a nitride spacer adjacent at least one sidewall of the polysilicon block;
   etching a portion of the polysilicon block opposite the nitride spacer to form an etched polysilicon block;
   oxidizing the etched polysilicon block to form an oxide spacer adjacent one side of a remaining narrower polysilicon block, the nitride spacer inhibiting oxidation of another side of the remaining narrower polysilicon block; and
   implanting a second dopant into substrate regions adjacent the remaining narrower polysilicon block to form heavily-doped source/drain regions,
   wherein the remaining narrower polysilicon block is used as a gate electrode.

32. The process of claim 31, further including implanting a third dopant, after etching and before oxidizing the polysilicon block, to extend one of the lightly-doped regions to the etched polysilicon block.

* * * * *